United States Patent [19]

Stern et al.

[11] Patent Number: 4,941,156
[45] Date of Patent: Jul. 10, 1990

[54] LINEAR JITTER ATTENUATOR

[75] Inventors: Kenneth J. Stern; John A. Beck, both of Austin, Tex.

[73] Assignee: Crystal Semiconductor, Austin, Tex.

[21] Appl. No.: 327,027

[22] Filed: Mar. 22, 1989

Related U.S. Application Data

[63] Continuation-in-part of Ser. No. 51,985, May 19, 1987, Pat. No. 4,805,198.

[51] Int. Cl.$^5$ .............................................. H04L 7/02
[52] U.S. Cl. ................................................... 375/118
[58] Field of Search ................ 375/118, 120; 331/179; 370/102, 105.3

[56] References Cited

U.S. PATENT DOCUMENTS

| | | | |
|---|---|---|---|
| 3,992,580 | 11/1976 | Bittel et al. | 375/118 |
| 4,270,183 | 5/1981 | Robinson et al. | 375/118 |
| 4,539,531 | 9/1985 | Thomas et al. | 331/179 |
| 4,716,575 | 12/1987 | Douros et al. | 375/118 |
| 4,805,197 | 2/1989 | Van Der Jagt et al. | 375/120 |

*Primary Examiner*—Douglas W. Olms
*Assistant Examiner*—Marianne Huseman
*Attorney, Agent, or Firm*—Gregory M. Howison

[57] ABSTRACT

A jitter attenuation circuit includes a FIFO data register (10) which is operable to receive data that is synchronized with a Write clock output therefrom synchronized with a Read clock. The data is written to the FIFO register (10) from a location determined by a Write pointer (12). The data is read out from the FIFO register (10) from a location determined by a Read pointer (14) which is clocked by a Read clock. The Read clock is synchronized with the Write clock by a phase lock loop (24). The phase lock loop (24) has a phase detector (26) which is operable to accrue phase error over intervals of $2\pi$ radians such that the phase lock loop (24) virtually never loses lock as a result of phase jitter on the Write clock. The phase lock loop (24) has contained therein a digitally controlled linear oscillator (28) wherein the phase detector (26) provides a quantized output to incrementally step the digitally controlled oscillator (28) up or down in frequency to track the Write clock while attenuating jitter thereon.

21 Claims, 4 Drawing Sheets

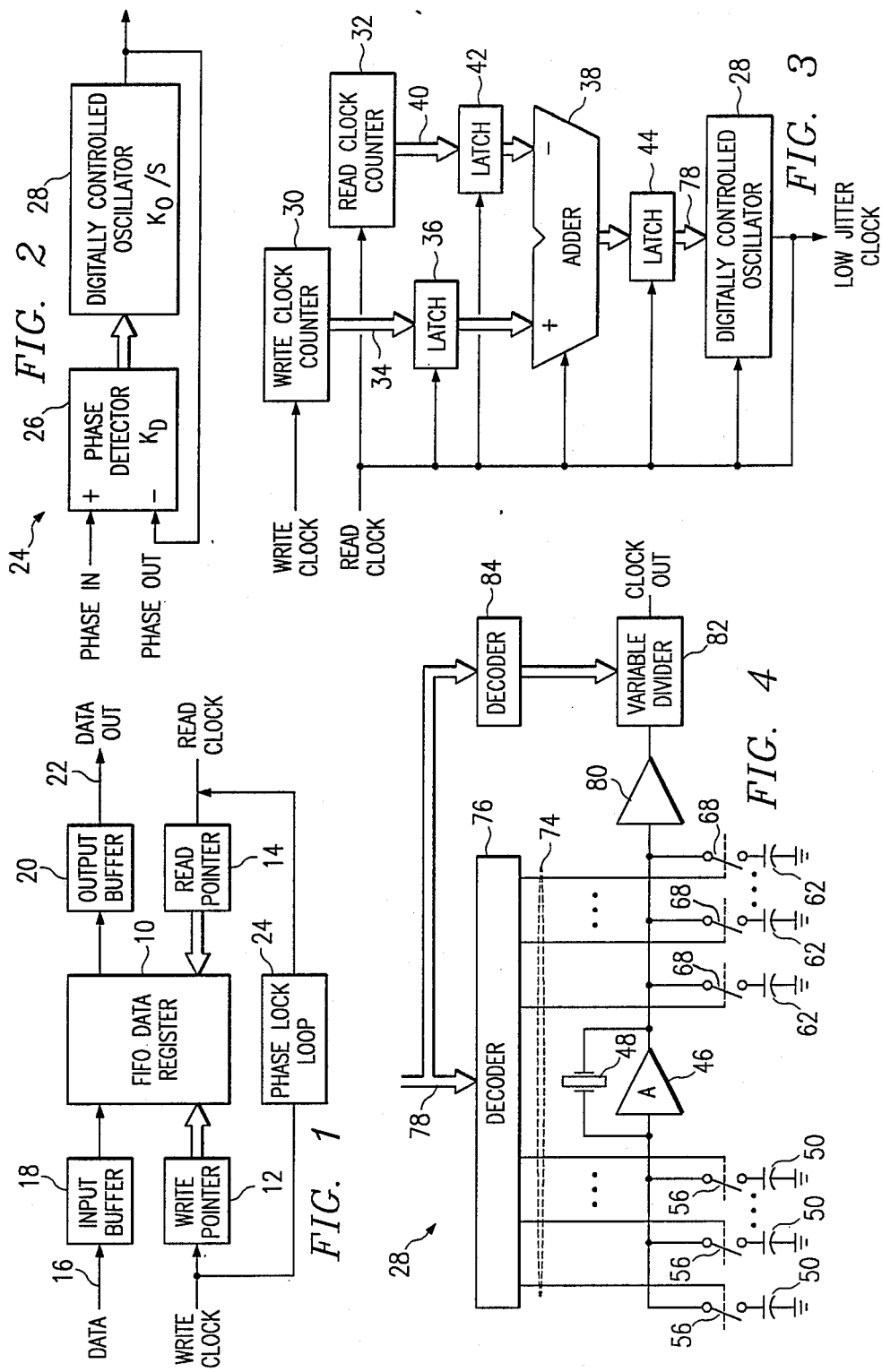

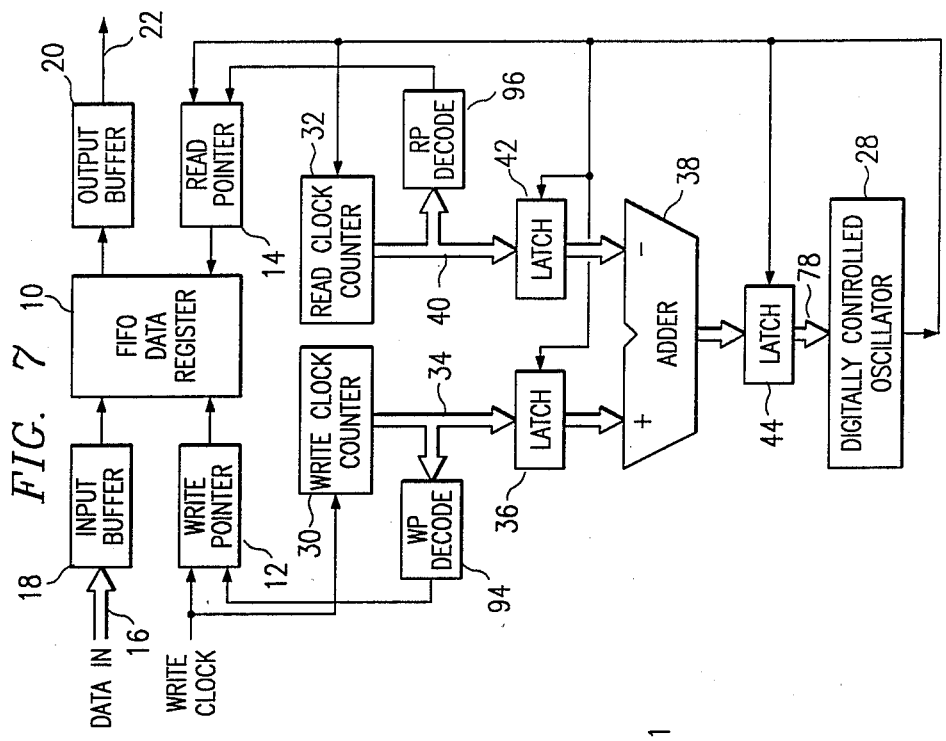
FIG. 7
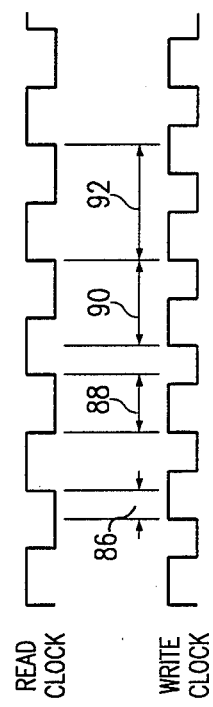
FIG. 5
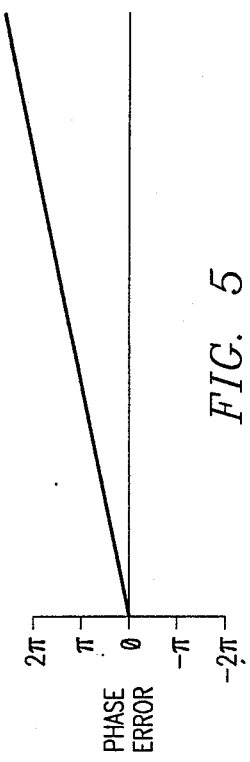
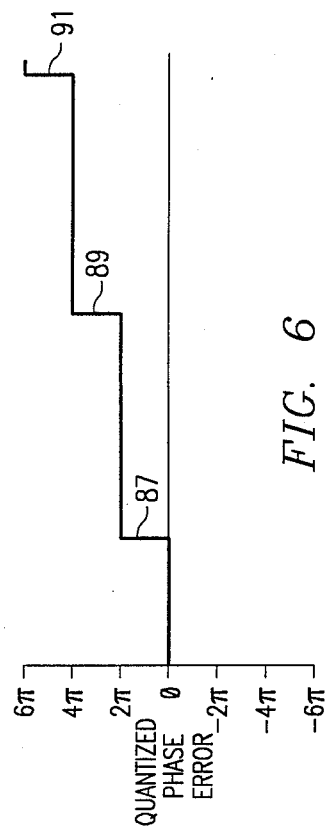
FIG. 6

LINEAR JITTER ATTENUATOR

CROSS REFERENCE TO RELATED APPLICATION

This application is a continuation-in-part of pending patent application Ser. No. 07/051,985, filed May 19, 1987 now U.S. Pat. No. 4,805,198, and entitled "CLOCK MULTIPLIER/JITTER ATTENUATOR", which application is hereby incorporated by reference.

TECHNICAL FIELD OF THE INVENTION

The present invention pertains in general to jitter attenuators, and more particularly to a jitter attenuator utilizing a FIFO in conjunction with a phase lock loop.

BACKGROUND OF THE INVENTION

Jitter attenuation is utilized where it is desirable to absorb phase variations from an incoming clock, which phase variations result from an imperfect transmission system. These phase variations, if not eliminated, can propagate through a system and cause significant errors. This is especially true in designing devices such as T1 line interface circuits. Typically, these types of devices have a specific jitter requirement associated therewith that must be met by the device manufacturer. Although circuitry presently exists to deal with present day levels of phase variations or jitter on a transmitted clock, this circuitry is generally disposed external to the chip. Increased levels of integration and chip density has mandated the need for new techniques to provide for on-chip jitter attenuators.

One type of jitter attenuation circuit that has been utilized in the industry is an elastic store circuit that absorbs variations in the rate at which data is received. This type of device utilizes a FIFO data register for temporarily storing the incoming data, which data is clocked into the data register by the incoming Write clock. This Write clock, which has undesirable jitter associated therewith, is utilized to increment a Write pointer that determines the location in the FIFO to which data is to be written. A stable Read clock is then generated that drives a Read pointer to output the stored data. Since the jitter is now removed from the incoming data stream, the only jitter present on the output data is that associated with the Read clock. However, it is necessary to insure that the Read clock does not deviate very far from the Write clock, since this will result in the FIFO approaching an underflow or an overflow state, such a state resulting in data errors. Therefore, these type of elastic store circuits utilize some type of control logic circuitry to either speed up the Read clock or slow down the Read clock whenever the FIFO is almost full or almost empty. The phase variations or jitter on the Read clock are therefore a function of this control logic circuitry.

SUMMARY OF THE INVENTION

The present invention disclosed and claimed herein comprises a jitter attenuator for attenuating jitter on received clock and an associated data stream. The jitter attenuator utilizes a FIFO data register for receiving and temporarily storing data in one of a plurality of data storage locations. A Write pointer is provided for determining the data storage location in the FIFO data register to which received data is to be stored. The Write pointer is incremented by the received clock which comprises a Write clock. A Read pointer is provided for determining the data storage location in the FIFO data register from which stored data is to be output. The Read pointer is incremented by a Read clock. Circuitry is provided for determining the difference between the Read and Write pointers with the Read clock being generated by a separate oscillator. The separate oscillator has the frequency thereof controlled such that the Read pointer and the Write pointer are disposed at a predetermined average difference. The magnitude of the variation in frequency of the Read clock is a function of the difference between the Read pointer and the Write pointer.

In one aspect of the present invention, the circuitry for controlling the Read clock comprises a phase lock loop wherein the Read clock is generated by a crystal controlled oscillator. The crystal controlled oscillator is controlled with switched capacitors which are switched in quantized steps to change the frequency thereof. The phase difference between the Read clock and the Write clock is determined by a digital phase detector which outputs a digital phase difference value. The difference value is decoded to generate control signals to determine which of the switched capacitors are selected.

In another aspect of the present invention, the phase detector is comprised of a Write counter and a Read counter. The Write counter is incremented by the Write clock and the Read counter is incremented by the Read clock. An adder is provided for receiving the outputs of the Write counter and the Read counter and outputting the difference thereof. The output is then decoded to provide the control signals for determining which of the capacitors are selected for the crystal controlled oscillator.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a block diagram of a jitter attenuator according the present invention;

FIG. 2 illustrates a block diagram of a phase lock loop utilized with the jitter attenuator circuit of FIG. 1;

FIG. 3 illustrates a block diagram of the phase detector utilized with the jitter attenuation circuit of FIG. 1;

FIG. 4 illustrates a block diagram of the switched capacitor oscillator utilized with the jitter attenuation circuit of FIG. 1;

FIG. 5 illustrates a timing diagram for phase error as a function of the difference between the Read clock and the Write clock;

FIG. 6 illustrates a graph of the phase error as a function of time;

FIG. 7 illustrates a detailed block diagram of the jitter attenuation circuit according to the present invention;

Figure 8:
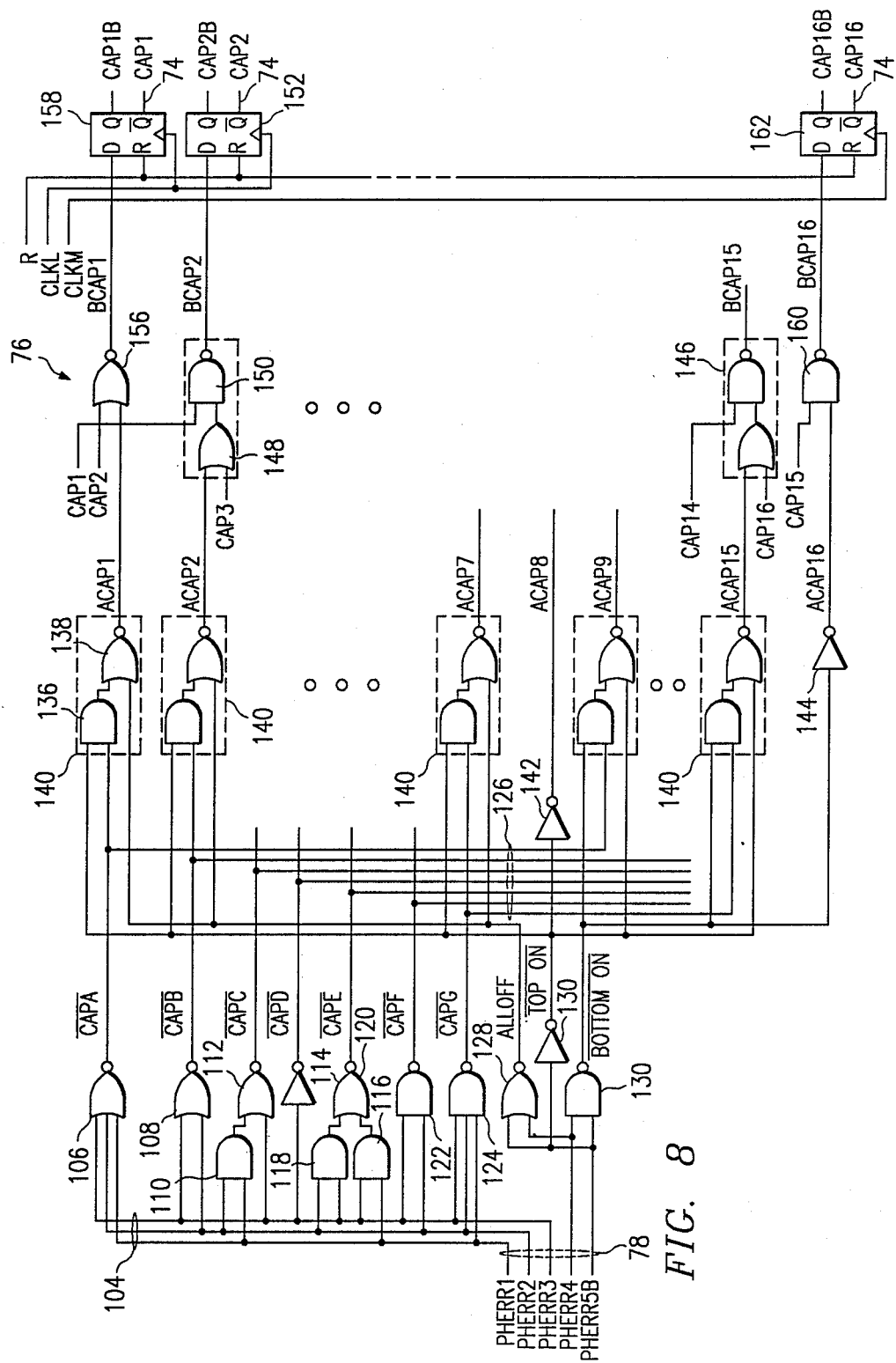
FIG. 8 illustrates a logic diagram of the decoder of FIG. 4 and the stepping circuit.

It will be appreciated that for purposes of clarity and where deemed appropriate, reference numerals have been repeated in the figures to indicate corresponding features.

DETAILED DESCRIPTION OF THE INVENTION

Referring now to FIG. 1, there is illustrated a FIFO data register 10 which, in the preferred embodiment, is a thirty-two bit data register comprised of thirty-two individual registers (not shown). Essentially, each individual register in the FIFO data register 10 can be written to and read from. The individual register in the FIFO data register 10 that is written to is determined by the value in a Write pointer 12, and the individual register from which data is to be read from is determined by a Read pointer 14. The Write pointer 12 and the Read pointer 14 are circulating registers with the Write pointer 12 receiving on the input thereof a Write clock and the Read pointer 14 receiving on the input thereof a Read clock. Typically, the Write pointer 12 is always ahead of the Read pointer 14 such that they do not overlap with data locations that are written to twice prior to being read from or merely read from twice. Data is received from a data input line 16 and buffered through an input buffer 18 for input to the FIFO data register 10. Data is then output through an output buffer 20 to an output data line 22.

When the Read clock and the Write clock are properly synchronized, the FIFO data register 10 is nominally operating in a half full/half empty state; that is, approximately sixteen bits of data are continually stored in the FIFO data register 10. However, if the Read clock varies slightly in frequency with respect to the Write clock, this could result in the FIFO data register 10 approaching the almost full or almost empty condition which, if exceeded, could result in the loss of data. In order to synchronize the Read clock and Write clock, a phase lock loop 24 is provided which receives on a phase input thereof the Write clock with the Read clock being generated and synchronized thereto. Although not shown in FIG. 1, the phase lock loop 24 incorporates a crystal-based oscillator to provide a relatively jitter free clock that is utilized as a Read clock. Therefore, the Read clock is jitter free with the FIFO data register 10 providing jitter free data on the output thereof.

One important feature of the phase lock loop 24, as will be described in more detail hereinbelow, is that it can accrue phase error over several multiple intervals of $2\pi$ radians without loss of data integrity. Therefore, in T1 application, phase lock loop 24 virtually never actually loses lock. This supplies an important advantage in that data integrity is now maintained with the value in the Read pointer always synchronized with respect to the position in the Write pointer. If for some reason a very low frequency sinusoid signal were to phase modulate the Write clock, this would result in the FIFO data register 10 being slightly more than half full or slightly more than half empty, but the Write pointer 12 and Read pointer 14 would never be unsynchronized from the standpoint of relative position and, thus, the phase lock loop 24 would never lose lock.

Referring now to FIG. 2, there is illustrated a schematic block diagram of the phase lock loop 24 of FIG. 1. The phase lock loop 24 is configured to have a phase detector 26 having a positive phase input and a negative phase input, the positive phase input connected to the Write clock and the negative phase input connected to the Read clock. The phase detector 26 has a gain $K_D$. The phase detector 26 is a digital circuit and provides a digital phase error signal on the output thereof which is input to a digitally controlled oscillator 28. The oscillator 28 is a crystal controlled oscillator which has a transfer function of $K_O/S$. The output of oscillator 28 is connected back to the negative input of the phase detector 26. As will be described hereinbelow, the phase lock loop 24 is a first order phase lock loop.

The open loop (forward) gain of the phase lock loop 24 is:

$$\frac{K_O K_D}{S}$$

which makes the closed loop phase transfer function equal to:

$$\frac{PH(O)}{PH(I)} = \frac{\frac{K_O K_D}{S}}{1 + \frac{K_O K_D}{S}} = \frac{1}{1 + \frac{S}{K_O K_D}}$$

where:
$K_D$ is in bits/$2\pi$ radians, and
$K_O$ is in radians/sec./bit

This system has a jitter attenuation bandwidth in radians/sec. of:

$$W_C = K_O K_D$$

The digitally controlled oscillator 28 receives on the input thereof a digital value which is decoded and the oscillator incremented in either the positive or negative direction in a quantized manner. The oscillator 28 is a linear oscillator providing a predetermined frequency increment per each bit of change in the value of the digital phase error signal on the output of the phase detector 26.

e preferred embodiment, the phase detector has a gain $K_D = 1$ bit/$2\pi$ radians in its simplest implementation. Also in the preferred embodiment, the loop bandwidth is 6 Hz. Therefore, the gain of the oscillator is approximately equal to 37.5 Hz/bit. In order to maintain the 6 Hz bandwidth, the oscillator 28 must provide this 37.5 Hz/bit step over the entire pull range of the oscillator 28. However, it should be understood that this bandwidth can be varied to provide various levels of jitter attenuation.

Referring now to FIG. 3, there is illustrated a more detailed block diagram of the phase detector 26. The phase detector 26 is comprised of a Write clock counter 30 which is a circulating counter that is clocked by the Write clock, which Write clock has jitter associated therewith. A Read clock counter 32, similar to the Write clock counter 30, is provided that is also a circulating counter and is clocked by the Read clock. The Write clock counter 30 is input through a bus 34 to a latch 36. The output of latch 36 is connected to the positive input of an adder 38. In a similar manner, the Read clock counter 32 has the output thereof input through a bus 40 to a latch 42, the output of latch 42 input to the negative input of adder 38. Each of the latches 36 and 42 are clocked by the Read clock nominally on the rising edge thereof and the adder 38 is operable to be controlled by the Read clock to sample the Read clock counter 32 and the Write clock counter 30 on the rising edge of the Read clock. The output of adder 38 is input to a latch 44, the output of latch 44 is then input to the digitally controlled oscillator 28.

The output of the adder 38 comprises the digital phase error signal with each bit representing a $2\pi$ radian interval of phase difference; that is, the phase error is quantized in $2\pi$ radian intervals. Therefore, the phase detector output will remain constant until the accrued change in phase error between the Write clock and the Read clock equals at least $2\pi$ radians, resulting in a change in the digital phase error signal on the output of the adder 38 by one bit, which output digital value is stored in latch 44.

In one aspect of the present invention, it can be seen that the phase error between the Write clock and the Read clock accrues at the output of the adder 30, representing the total phase error between the Read and the Write clocks. For example, if the phase error were initially equal to zero and the Write clock were incremented in frequency to a frequency having a period that has a duration that is ten percent less than the period of the Read clock, it would take ten cycles before the phase error were equal to three hundred sixty degrees or $2\pi$ radians. Therefore, after ten cycles of the Write clock at this higher frequency, the output of the adder 38 would be changed by one bit. If the Read clock were not compensated for, this phase error would continue to accrue and in the next ten cycles, the accrued phase error would be $4\pi$ radians. This would continue until the Read clock were adjusted which, in the present invention, is achieved with a first order phase lock loop. Once the Read clock is adjusted by increasing the frequency of the digitally controlled oscillator 28, the phase error is reduced to a static phase error as will be described hereinbelow.

In another aspect of the present invention, the output of the adder 38 is adjusted to provide a zero degree phase error whenever the difference between the Write clock counter 30 and the Read clock counter 32 is equal to sixteen bits. This represents the half full/half empty status of the FIFO data register 10. In this manner, when the count difference is greater than fifteen, a positive phase error exists, and when the count is less than fifteen, a negative phase error exists. In addition, when the count value approaches thirty-two or zero, this will represent an almost full or an almost empty status, respectively.

In order to provide a phase error of zero degrees for a count difference of 16, the adder 38 in the preferred embodiment is offset such that the output thereof is zero for a count difference of sixteen. The difference value ranges from zero to thirty-two with a difference value of sixteen corresponding to a phase error that results in a nominal zero frequency offset in the oscillator 28.

Referring now to FIG. 4, there is illustrated a schematic block diagram of the digitally controlled oscillator 28. As will be described in more detail hereinbelow, the gain of the oscillator 28 in the preferred embodiment is linear such that the 37.5 Hz/step is constant for all phase error values. The oscillator is comprised of an amplifier 46 having a gain of "A". A crystal 48 is disposed across the input and output of the amplifier 46 to provide positive feedback and form an oscillator. The frequency of oscillation is primarily determined by the crystal 48 which has a predetermined fundamental operating range. Without further tuning components, the internal capacitance of the amplifier 46 and the parameters of the crystal 48 will result in the oscillator operating at a predetermined operating frequency. This operating frequency can be varied over a limited range by capacitive tuning techniques. However, the crystal 48 when incorporated into the oscillator has non-linear characteristics over this tuning range and these must be accounted for in order to provide a linear variable oscillator. If the oscillator frequency variation were not linear over its operating range, the jitter attenuation would be dependent upon the amplitude of the phase variations on the Write clock and the gain of the oscillator.

In the present invention, the frequency of the oscillator is varied by selectively connecting one or more discrete capacitors either between the input and ground, or the output and ground, or both to provide a predetermined amount of load capacitance $C_L$. In the preferred embodiment, capacitance is added or subtracted on both sides. On the input side of the amplifier 46, sixteen switched capacitors 50 are provided each having one side thereof connected to ground. The other sides of the capacitors 50 are connected to one side of sixteen associated switches 56. The switches 56 are connected to the input of amplifier 46. In a similar manner, on the output side of the amplifier 46, sixteen capacitors 62, are provided each having one side thereof connected to ground. The other sides of the capacitors 62 are connected to one side of sixteen associated switches 68. The other side of switches 68 are connected to the output terminal of the amplifier 46.

Each of switches 56 and 68 are controlled by a separate one of a plurality of control lines 74 which are output from a decoder 76. The decoder 76 receives on the input thereof the output of latch 44 through a bus 78. Decoder 76 is operable to decode the digital phase error signal output by adder 38 and select one or more of the capacitors 50 and the corresponding one of the capacitors 62. In the preferred embodiment at T1 data rates and with an ideal crystal, this provides a quantized variable oscillator which varies in steps of 37.5 Hz for each bit change in the output of the adder 38. This corresponds to a 37.5 Hz change for each $2\pi$ radians of phase error between the Read clock and the Write clock. The delta change in capacitance for each step is as follows:

$$\Delta C = \frac{\Delta 2 C_{OLD}^2 \, \Delta f/f_s}{C_x - 2C_{OLD} \, \Delta f/f_s}$$

$\Delta C$ = added capacitance
where $C_{OLD}$ = load capacitance $C_L$ at the previous (next higher) frequency step
f = resulting added frequency reduction
$f_s$ = series resonant frequency of the crystal
$C_x$ = internal series capacitance of the crystal The output of the oscillator is connected to the input of a buffer 80 which has the output thereof connected to the input of a variable divider 82. The variable divider 82 nominally operates at a divide-by-four value to provide the clock on the output thereof. However, the variable divider 82 is also operable to vary the divide ratio by an increment of 0.5 in both the positive and negative direction to give either a higher clock output frequency or a lower clock output frequency. This varies the gain of the oscillator to prevent loss of data integrity, as will be described in more detail hereinbelow. The variable divider 82 has a control input thereof connected to the output of a decoder 84 which decodes the output of adder 38. The decoder 84 is operable in the almost full and almost empty condition of the FIFO data register 10 to vary the divide ratio of the divider 82. This will be described in more detail hereinbelow.

The oscillator in the preferred embodiment operates at a frequency that is four times the frequency of the Read clock that is output by the variable divider 82. The Read clock operates at a nominal frequency of 1.5437 MHz. Changing the load capacitance $C_L$ from 40 pf to 10 pf has been found experimentally to change the frequency of the Read clock from 1.543700 MHz to 1.5443 MHz. This is a frequency delta of 600 Hz. This is divided into sixteen equal steps of 37.5 Hz with the quantized output of the phase detector 26 controlling the quantized load capacitance $C_L$ in the oscillator. The capacitance steps are non-linear so that they compensate for the non-linearity in the frequency equation to give a net linear control in the feedback loop. The capacitance values of the load capacitors 50 and 62 are selected such that the delta capacitance for each of the sixteen steps provides a frequency change of 37.5 Hz per step.

Although not illustrated, it should be understood that the decoder 76 and the capacitors 50–54 and 62–66 could be replaced by a voltage controlled varactor. The value of the control voltage for the varactor could be prestored in a PROM having a digital-to-analog converter provided convert the digital value to an analog output as the control voltage. Therefore, the characteristics of the varactors and associated control voltages could be calculated to provide the precise capacitance values to achieve the 37.5 Hz step with the digital phase error signal output by the adder 38 being provided as an address for the PROM.

The decoder in the preferred embodiment, in addition to decoding the output of phase detector 26 is also operable to limit the change in frequency of the Read clock to one step for every clock cycle of the Read clock. Therefore, when a variation having a magnitude of multiple $2\pi$ radian intervals occurs, multiple cycles of the clock would be required to reflect this phase variation in the Read clock. For example, if the magnitude of the phase variation were $16\pi$ radians, this would require the Read clock to change its frequency by 300 Hz or eight steps. This would require eight clock cycles, each clock cycle representing a frequency change of 37.5 Hz. In this manner, an additional amount of jitter attenuation is provided with the maximum requirement of one step per clock cycle providing some filtering. One step at a time provides less transient effect on the oscillator and thereby more ideal behavior than multiple steps. However, it is possible to operate without the single steps.

Referring now to FIG. 5, there is illustrated a timing diagram for one example of the operation of the phase lock loop 24. In this example, a step function is provided for the Write clock frequency wherein the frequency is increased and the period of the Write clock decreased to a duration that is twenty-five percent less than the period of the Read clock. This corresponds to a thirty-three percent increase in frequency. Initially, the phase error value is zero at time $t_0$. When the step function occurs, the frequency of the Write clock is increased such that the next rising edge of the Write clock occurs $2\pi/4$ radians before the rising edge of the Read clock, representing a phase error of $\pi/2$ radians, as denoted by a reference numeral 86. The phase error is determined on each rising edge of the Read clock. The next rising edge of the Write clock occurs $\pi$ radians before the next rising edge of the Read clock, resulting in an accrued phase error of x radians. This is denoted by a reference numeral 88. The next rising edge of the Write clock occurs $3\pi/2$ radians before the next rising edge of the Read clock, as denoted by reference numeral 90. The next rising edge of the Write clock occurs $2\pi$ radians prior to the next rising edge of the Read clock, as denoted by reference numeral 92.

Therefore, after four cycles of the Write clock at the increased frequency, there is a total of $2\pi$ radians of phase error accrued.

As described above, the phase detector is quantized, such that no change in the digital phase error signal is made until a phase error of at least $2\pi$ radians is present. The frequency of the Read clock will then be increased by a quantized step which, in the preferred embodiment, is 37.5 Hz. Of course, this magnitude of frequency change in the Read clock will not offset the change in frequency in the Write clock since the center frequency in the Read clock is nominally 1.5437 MHz with the Write clock now operating at 2.0583 MHz. Therefore, the phase error will continue to increase until an additional $2\pi$ radians of phase error is accrued causing the oscillator to be incremented by an additional 37.5 Hz. This will continue until the frequency of the Read clock equals the frequency of the Write clock. Of course, a thirty-three percent increase in frequency is not contemplated in the present application and was chosen by way of example only.

From the standpoint of jitter in the present application, a thirty-three percent change in the Write clock frequency would never occur. However, instantaneous jitter on the Write clock could result in an instantaneous phase error of more than $2\pi$ radians. Under these conditions, this phase error would be accrued as a positive or negative phase error and then a subsequent occurrence of jitter in the opposite direction would negate this phase accrual, resulting in no change in the average phase error. However, the oscillator, which comprises the Read clock will track the phase error with an increase or decrease of frequency of 37.5 Hz for each phase variation of $2\pi$ radians. It is important to note that a low amplitude of phase jitter of, for example, $4\pi$ radians peak-to-peak will result in a total frequency variation of $\pm 37.5$ Hz. A much larger phase variation of, for example, $12\pi$ radians peak-to-peak would result in a frequency variation on the Read clock of $\pm 225$ Hz. Therefore, it can be seen that the actual frequency variation of the Read clock relative to variations of the Write clock is significantly reduced and is a function of the gain of the phase detector and the gain of the oscillator.

Referring now to FIG. 6, there is illustrated a plot of quantized phase error over time representing a change in frequency of the Write clock with respect to the Read clock. Initially, it is assumed that the static phase error is zero radians. When the Write clock changes frequency in this example, a positive phase error results. The positive phase error will accrue for an amount of time until the total phase error is equal to $2\pi$ radians at a point 87. At this time, the output of the adder changes value by a digital value of one, representing a phase error of $2\pi$ radians and the digitally controlled oscillator 28 is increased in frequency by 37.5 Hz. At this point, the rate of change of phase error is decreased, but phase error continues to accrue from the previous value of $2\pi$ radians until the total phase error is equal to $4\pi$ radians at a point 89. At this point, the output value of the adder 38 is again incremented by a digital value of one and the frequency of the oscillator changed by another 37.5 Hz step. The rate of change of phase error again decreases but phase error continues to accrue from the value of $4\pi$ radians until a value of $6\pi$ radians at a point 91. The output of the adder 38 is again incremented by a digital value of one and the oscillator frequency incremented by 37.5 Hz. At this point in the present example, the edges of the Read and Write clocks are synchronized such that $6\pi$ radians represents the static phase error of the loop. As long as the average frequency of the Write clock remains the same, the average value of the phase error will remain the same with phase jitter on the Write clock causing variations in the instantaneous phase error but not changing the average phase error. However, as described above, any phase variation in the Write clock that is greater than multiple increments of $2\pi$ radians will be accrued such that the loop never loses lock; that is, the relative phase of the Read and Write clocks is always maintained. As long as the average phase error does not change, a static difference between the two pointers will be maintained.

Referring now to FIG. 7, there is illustrated a detailed logic block diagram of the jitter attenuator illustrating the interconnection of the various components. In the preferred embodiment, the counters 30 and 32 are utilized to provide an important function of the Write and Read pointers, respectively. The output of the Write clock counter 30 is decoded through a decode circuit 94 which is input to the Write pointer 12. As described above, the Write pointer 12 is a circulating shift register with the decode circuit 94 operable to decode the Write clock counter 30 and output a pulse every thirty-two counts. This pulse is then input to the Write pointer 12 which is a serial shift register, and this digital value of one shifted therethrough by the Write clock. Therefore, every thirty-two counts of the Write clock, another digital value of one is loaded into the shift register for the Write pointer 12 and shifted therethrough by the Write clock. A decode circuit 96 is provided for decoding the output of the Read clock counter 32 every thirty-two clock cycles, the output of which is input to the Read pointer 14. The Read pointer 14 is a serial shift register which is clocked by the Read clock to clock the digital value of one therethrough.

As described above, the gain of the oscillator 28 is linear in that it provides quantized frequency steps of 37.5 Hz per bit of the phase detector 26. However, when the Write clock for whatever reason varies to such an extent to cause the approach of an overflow or an underflow condition in the FIFO data register 10, the decoder 84, shown in FIG. 4, that controls the variable divider 82 detects this condition and changes the divide ratio. For example, if the condition were met where the Write clock had decreased in frequency allowing the Read clock to catch up with it, this could result in an underflow condition. When the difference between the Read and Write clocks approaches zero, the decode circuit 84 changes the divide ratio of the divider 82 to 4.5. This allows the frequency of the Read clock to be significantly decreased relative to the Write clock. However, the linearity of the oscillator is significantly changed at this point, thus changing the jitter attenuation. In a similar manner, if the Write clock is ahead of the Read clock, an overflow condition may occur, and when the difference begins to approach the maximum capacity of the FIFO data register 10, the decode circuit 84 detects this and changes the divide ratio of the divider 82 to a value of 3.5. The purpose of changing the divide ratio at these points is to prevent loss of data due to underflow or overflow, which condition occurs when substantial jitter or phase deviation beyond the normal tolerance of the circuit is present on the Write clock.

Referring now to FIG. 8, there is illustrated a logic diagram of the decoder 76 of FIG. 4 which is utilized to select the capacitors in the crystal oscillator 28. The adder 38 provides a subtraction operation with a 2's complement method. A five-bit word is output representing the phase error. The first four bits PHERR1, PHERR2, PHERR3 and PHERR4 provide a four-bit value with a bit PHERR5 providing the sign bit. The sign bit is inverted to provide the signal PHERR5-bar, which is output on the bus 78. This provides the capability of ranging from 0 to $+15$ and $-1$ to $-16$ with a sign bit. As described above, there are only sixteen capacitors such that the actual decoder only ranges from 0 to $+8$ and 0 to $-8$ with a value of $+8$ representing a condition where all the capacitors are in. The sign bit is inverted to provide centering in a 2's complement code.

The decoding operation is initially provided by a first decoding section which decodes the three bits PHERR1, PHERR2 and PHERR3. The three bits are input to a bus 104 comprising first, second and third bit lines corresponding to the bits PHERR1, PHERR2 and PHERR3. All three bit lines are input to a three-input NOR gate 106 representing the output CAPA-bar. The second and third bit lines are connected to the inputs of a two-input NOR gate 108, representing the output CAPB-bar. The first and second bit lines are input to the input of a two-input AND gate 110 which has the output thereof connected to the input of a NOR gate 112. The other input of the NOR gate 112 is connected to the third input line to provide the output CAPC-bar. The third bit line is input to an inverter 114, the output of which provides the output CAPD-bar. The first and third bit lines are input to an AND gate 116 and the second and third bit lines are input to an AND gate 118. The outputs of AND gates 116 and 118 are input to a NOR gate 120, the output of which provides the CAPE-bar output. The second and third bit lines are connected to the inputs of a NAND gate 122, the outputs of which provide the CAPF-bar signal. The first, second and third bit lines are input to the inputs of a three-input NAND gate 124, the output of which provides the CAPG-bar signal. Each of the outputs CAPA-bar--CAPG-bar are input to one of seven lines in a bus 126. The CAPA-bar--CAPG-bar outputs represent the decoded portions of the first three bits PHERR1-PHERR3 wherein the number of outputs that are on is a function of the value from zero to seven.

The PHERR4 line from bus 78 is input to one input of a NOR gate 128 and also to one input of a NAND gate 132. The bit PHERR5B is also input to one input of the NOR gate 128 and also to one input of the NAND gate 130 and also to the input of an inverter 132. The NOR gate 128 provides the output ALLOFF indicating a condition where all of the capacitors are out, the NAND gate 130 outputs a signal BOTTOMON-bar to represent the control signal for the bottom eight capacitors and the output of inverter 132 is labelled TOPON-bar, representing the control signal for the top eight capacitors. Therefore, there are four conditions, all of the capacitors in, all of the capacitors in the top half being in and decode bottom, all of the capacitors in the bottom half being out and decode top, and all of the capacitors out. Therefore, whenever PHERR4 and PHERR5 are both zero, this represents an ALLOFF condition wherein all of the capacitors are out.

The capacitors, as described above, are divided into a group of the top eight capacitors and a group of the bottom eight capacitors with each of the capacitors having associated therewith a second level of decoding, a stepping circuit and an output flip flop to output control signals CAP1 through CAP16 for capacitors one through fifteen. The second level of decoding for capacitors one through seven and nine through sixteen is comprised of a two-input AND gate 136 having the output thereof connected to one input of a two-input NOR gate 138. This decoding circuit is generally referred to by the reference numeral 140. Each of the decoder circuits 140 associated with capacitors one through seven has one input of the AND gate 136 connected to the signal TOPON-bar output by the inverter 132 and the other input of the AND gate 136 connected to one of the seven lines 126. The other input to the NOR gate 138 is connected to the signal ALLOFF output of the NOR gate 128. The inverter 142 has the input thereof connected to the signal TOPON-bar. Each of the decoder circuits 140 associated with the capacitors nine through fifteen, has one input of the AND gate connected to the output BOTTOMON-bar output signal from the NAND gate 130 and the other input of the AND gate 136 connected to one of the six lines in the bus 126. The other input of the NOR gate 138 is connected to the TOPON-bar signal output from inverter 132. Inverter 144 has the input thereof connected to the BOTTOMON-bar signal. Therefore, the second level of decoding provides a separate output for each of the capacitors, which output is sequentially turned on as a function of the value of the digital word output from the adder 38.

The decoding scheme results in the following table for PHERR5 (5), PHERR4 (4), PHERR3 (3), PHERR2 (2), and PHERR1 (1) as illustrated in the following table:

| 5 | 4 | 3 | 2 | 1 | # of Caps In | Comments |
|---|---|---|---|---|--------------|----------|
| 0 | 1 | 1 | 1 | 1 | 16 Caps In   |          |
| : |   |   |   |   |              | All Caps In |
| 0 | 1 | 0 | 0 | 0 | 16 Caps In   |          |
| 0 | 0 | 1 | 1 | 1 | 15 Caps In   |          |
| 0 | 0 | 1 | 1 | 0 | 14 Caps In   |          |
| 0 | 0 | 1 | 0 | 1 | 13 Caps In   |          |
| 0 | 0 | 1 | 0 | 0 | 12 Caps In   |          |
| 0 | 0 | 0 | 1 | 1 | 11 Caps In   |          |
| 0 | 0 | 0 | 1 | 0 | 10 Caps In   |          |
| 0 | 0 | 0 | 0 | 1 | 9 Caps In    |          |
| 0 | 0 | 0 | 0 | 0 | 8 Caps In    |          |
| 1 | 1 | 1 | 1 | 1 | 7 Caps In    |          |
| 1 | 1 | 1 | 1 | 0 | 6 Caps In    |          |
| 1 | 1 | 1 | 0 | 1 | 5 Caps In    |          |
| 1 | 1 | 1 | 0 | 0 | 4 Caps In    |          |
| 1 | 1 | 0 | 1 | 1 | 3 Caps In    |          |
| 1 | 1 | 0 | 1 | 0 | 2 Caps In    |          |
| 1 | 1 | 0 | 0 | 1 | 1 Cap In     |          |
| 1 | 1 | 0 | 0 | 0 | 0 Caps In    | No Caps In |
| 1 | 0 | 0 | 0 | 0 | 0 Caps In    | No Caps In |

In the system of the present invention, it is important to prevent more than one capacitor turning on at a time such that there are no large jumps in frequency output from the oscillator 28. To facilitate this, the decoder is restricted to turning on or turning off only one capacitor per clock cycle. Each output from the second level decoder section is labelled ACAP1–ACAP16. Each of the outputs ACAP2–ACAP15 is input to a stepping circuit 146 which is comprised of a two-input OR gate 148 having the output thereof connected to one input of a two-input NAND gate 150. The OR gate 148 for each of the circuits 146 has one input thereof connected to the ACAPX-output. The output of the NAND gate comprises the output BCAPX where X varies from two to fifteen. The output BCAPX is input to the D-input of a D-type flip flop 152, the Q-output thereof providing the output CAPXB and the Q-bar output providing the output CAPX where X varies from two to fifteen. The flip flop 152 is clocked by a clock signal on a clock input thereof and a reset signal provided for the reset input thereof. The other input of the OR gate 148 is connected to the CAP(X+1) signal and the NAND gate 150 is connected to the CAP(X−1) signal. Therefore, for the output ACAP2, the other input of the OR gate 148 is connected to the CAP3 output from the flip flop 152 associated with a third capacitor, and the other input of the NAND gate 150 is connected to the CAP1 output associated with the output from the flip flop associated with the first capacitor.

The output signal ACAP1 is connected to the output of a two-input NOR gate 156, the other input thereof connected to the CAP2 output from flip flop 152. The output of NOR gate 156 is connected to the D-input of a flip flop 158, the Q-output thereof providing the CAP1-bar signal and the Q-bar output providing the CAP1 signal. In a similar manner, the ACAP16 output is connected to one output of a two-input NAND gate 160, the other input thereof connected to the CAP15 output from the flip flop 152 associated with the fifteenth capacitor. The output of AND gate 160 is connected to the D-input of a flip flop 162, the Q-output thereof providing the CAP16-bar output and the Q-bar output providing the CAP16 output. The clock signals comprise split clocks CLKL and a CLKM for drive (fan out) considerations. The CLKL signal is connected to the flip flops 158 and the flip flops 152 associated with outputs the second, third, sixth, seventh, tenth, eleventh and fourteenth capacitors. The CLKM clock signal is connected to the clock inputs of the remaining of the flip flops 152 and the flip flop 162 to provide the clock signal therefore. Therefore, it can be seen that any change in the digital value on the bus 78 will never result in more than one capacitor being taken in or out of the oscillator circuit for each Read clock cycle.

Figure 9:
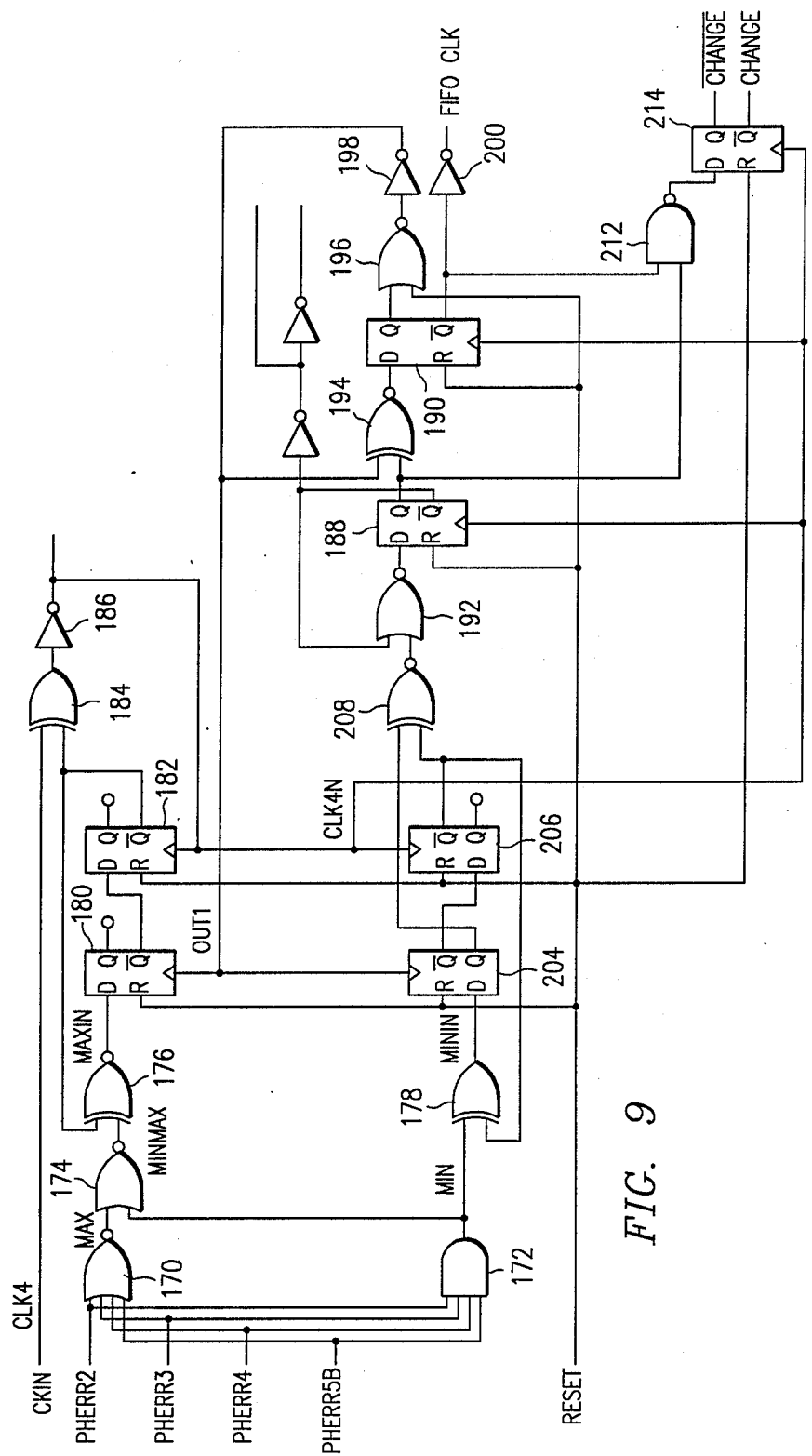
FIG. 9 illustrates a logic diagram of the variable divide circuit 82 and decoder 84.

Referring now to FIG. 9, there is illustrated a logic diagram of the variable divide circuit 82 and decoder 84. The bits PHERR3, PHERR4 and PHERR5B are sampled to determine if the value is either a positive 14 or, or a negative 15 or 16. This is represented when either all the values are one for a MIN condition or all the values are zero for a MAX condition. All three bits are input to a four-input NOR gate 170 to provide an output MAX and also into a four-input AND gate 172 to provide a MIN output. The output of NOR gate 170 is input to one input of a two-input NOR gate 174, the output of which provides the MINMAX signal and the other input of OR gate 174 is connected to the output of AND gate 172. The output of NOR gate 174 is connected to one input of an exclusive NOR gate 176 to provide the signal MAXIN. The output of AND gate 172 is similarly connected to one input of an exclusive OR gate 178 to provide on the output thereof the MININ signal.

The output of exclusive NOR gate 176 is connected to the D-input of a flip flop 180, the Q-bar output of which is connected to the D-input of a flip flop 182. Flip flop 182 has the Q-bar output thereof connected to the other input of exclusive NOR gate 176 and also to one input of an exclusive OR gate 184. The other input of exclusive OR gate 184 is connected to a signal CLK4 which represents the output of the crystal oscillator. The output of exclusive OR gate 184 is connected to the input of inverter 186, the output of which provides the inverted CLK4 signal CLK4N. This is connected back to the clock input of flip flop 182.

A divide-by-two circuit is provided with two flip flops 188 and 190, the D-input of flip flop 188 connected to the output of a NOR gate 192 and the D-input of flip flop 190 connected to the output of an exclusive NOR gate 194. Gate 192 has one input thereof connected to the Q-bar output of flip flop 188 and gate 194 has one output thereof connected to the Q-output of flip flop 188. The Q-output of flip flop 190 is connected to one input of an OR gate 196, the output of which is connected through an inverter 198 back to the other input of gate 194. The output of inverter 198 is connected to the clock input of flip flop 180 to provide the signal OUT1. Flip flops 188 and 190 are both clocked by the CLK4N signal and are operable in the non-overflow or non-underflow condition to provide a divide-by-four circuit. However, when there is an underflow condition, the MAX signal is generated on the output of gate 170 to indicate a divide-by-3.5 operation wherein the flip flops 180 and 182 control the operation of the exclusive OR gate 184 to selectively invert the CLK4N signal approximately every four cycles to subtract one half cycle from frequency division operation. This is facilitated since the circuitry is controlled by rising edges. The output to the FIFO is provided on the Q-bar output of the flip flop 190 through an inverter 200.

For the divide-by-4.5 operation, flip flops 204 and 206 are provided. The Q-bar output of flip flop 204 connects to the D-input of flip flop 206. The MININ output of gate 178 is connected to the D-input of flip flop 204 with the reset inputs of flip flops 204 and 206 connected to a reset input. The clock input of flip flop 204 is connected to the OUT1 signal and the clock input of flip flop 206 is connected to the input of the CLK4N signal. The Q-bar output of flip flop 206 is connected back to the other input of the gate 178 and also to one input of an exclusive NOR gate 208. The other input of the exclusive NOR gate 208 is connected to the Q-output of flip flop 204. The flip flops 204 and 206 and the gates 208 and 192 provide a logic delay in the first divide-by-two operation that causes the flip flops 188 and 190 to provide a divide-by-4.5 operation.

A two-input NAND gate 212 is provided having one input thereof connected to the Q-bar output of flip flop 190 and one input thereof connected to the Q-output of flip flop 188. The output of gate 212 is connected to the D-input of a flip flop 214, the reset input thereof connected to the reset line and the clock input thereof connected to the CLK4N input. The flip flop 214 outputs a CHANGE-bar signal on the Q-output thereof and a CHANGE signal on the Q-bar output. These two signals are utilized to precharge capacitors to a predetermined reference voltage when they are not connected to the oscillator. This provides a predetermined voltage across the capacitor such that there is no transient that results during connection of the capacitor.

In summary, there has been provided a jitter attenuation circuit which utilizes a phase lock loop controlled FIFO data register. The FIFO data register has the data throughput controlled by a Write pointer and a Read pointer which are nominally disposed to provide a half full/half empty condition. The Read pointer is controlled by a Read clock and the Write pointer is controlled by a Write clock which Write clock has jitter associated therewith. A first order phase lock loop is provided that receives the Write clock and locks it to a crystal controlled oscillator. The output of the crystal control oscillator provides the Read clock. The phase detector in the phase lock loop operates such that it allows phase variations of greater than $2\pi$ radian intervals and multiples thereof without losing lock, with phase error being accrued. Further, the frequency of the oscillator is changed in linear quantized steps that are a function of the magnitude of the phase error.

Although the preferred embodiment has been described in detail, it should be understood that various changes, substitutions and alterations can be made therein without departing from the spirit and scope of the invention as defined by the appended claims.

What is claimed is:

1. A jitter attenuator for attenuating jitter on a received clock and associated data, comprising:
    an elastic store device for receiving the data for storage therein at the clock rate of the received clock, which received clock comprises a Write clock, and outputting data at a rate determined by a Read clock;
    difference means for determining the phase difference between said Write clock and said Read clock;
    clock generating means for generating said Read clock, said Read clock variable in discrete substantially equal steps in response to a digital input signal; and
    digital lock means for generating the digital input signal for controlling the frequency of said Read clock in said discrete steps to maintain said phase difference at a static phase difference, each of said discrete steps corresponding to a finite amount of said phase difference, the magnitude of the variation in frequency of said Read clock being a function of the amount that the magnitude of said phase difference, as determined by said difference means, varies from said static difference, said lock means operable to attenuate phase variations of said Read clock relative to phase variations in said Write clock;
    said lock means substantially linearizing the variations of said clock generating means with respect to said phase difference, such that a change in said phase difference results in a corresponding and substantially linear variation in the frequency of said clock generating means over the range of said clock generating means.

2. The jitter attenuator of claim 1 wherein said difference means and said lock means comprise a phase lock loop, said lock means having:
    conversion means for converting said phase difference value output by said difference means into a digital phase error signal having discrete values, each discrete value representing a finite amount of phase change in said phase difference, said digital phase error signal comprising said digital input signal; and frequency means for varying the frequency of said clock generating means as a function of said digital phase error signal to maintain an average phase error on the output of said conversion means, said average phase error comprising said static difference, said frequency means varying said clock generating means in a substantially linear manner with respect to variations in said phase difference.

3. The jitter attenuator of claim 2 wherein said difference means and said conversion means comprise:
a Write counter for being incremented by said Write clock;
a Read counter for being incremented by said Read clock; and
an adder operating in a different mode and having first and second inputs for receiving the output of said Read and Write counters, respectively, the output of said adder comprising said digital phase signal;
Wherein said frequency means is operable to receive said digital phase error signal as said digital input signal.

4. The jitter attenuator of claim 2 wherein said difference means and said lock means comprise a first order phase lock loop.

5. The jitter attenuator of claim 2 wherein:
said digital phase error signal is quantized in increments for each $2\pi$ radians of said phase difference; and
said frequency means comprises means for varying the frequency of said clock generator means in quantized steps for each bit change in said digital phase error signal.

6. The jitter attenuator of claim 5 and further comprising means for changing the size of said quantized step in frequency when the value of said phase difference exceeds a predetermined threshold in either the positive or the negative direction.

7. The jitter attenuator of claim 5 wherein said clock generating means comprises a switched capacitor crystal oscillator with decoder means for receiving the digital phase error signal and decoding the digital phase error signal to output control signals to select the combination of switched capacitors to provide the linear quantized steps.

8. The jitter attenuator of claim 1 wherein said elastic store device comprises:
a FIFO data register having a plurality of data storage locations for storing data;
a Write pointer for determining the data storage location in said FOFO data register to which said received data is to be stored, said Write pointer incremented by the received clock in a predetermined sequence;
a Read pointer for determining the data storage location in said FIFO data register from which stored data is to be output, said Read pointer incremented by said Read clock in said predetermined sequence; and
said phase difference comprising the difference between said Write pointer and said Read pointer in accordance with said predetermined sequence.

9. A jitter attenuator for attenuating jitter on an external clock signal, comprising:
a clock generator for generating a reference clock, said reference clock having a variable frequency that is variable in discrete steps in response to receiving a digital input error correction signal;
receive means for receiving the external clock signal;
a phase comparator for comparing the phase of said clock generator and the phase of the external clock and determining the phase difference therebetween for multiple $2\pi$ intervals of the phase difference to output a phase error value representative of the absolute phase difference between the received external clock and said clock generator;
lock means for generating said digital error correction signal for controlling the frequency of said clock generator to maintain said phase error value at a predetermined average phase error, the magnitude of the variation in frequency of said clock generator being a function of the amount that the magnitude of said phase error value, as determined by said phase comparator, varies from said predetermined average phase error, said lock means operable to attenuate phase variations of said clock generator relative to phase variations in said received external clock; and
means for linearizing said clock means to vary the frequency of said clock generator in a stepwise linear manner relative to the variation in said phase error value over the range of variation of said clock generator.

10. The jitter attenuator of claim 9 wherein said phase comparator and said lock means comprise:
a first counter for being incremented by said received external clock signal;
a second counter for being incremented by said clock generator; and
an adder operating in a difference mode and having first and second inputs for receiving the output of said first and second counters, respectively, the output of said adder comprising said digital error correction signal, each discrete change in the value of said digital error correction signal representing a larger change in said phase error value;
wherein said clock generator and said means for linearizing are operable to receive said digital phase error signal.

11. The jitter attenuator of claim 10 wherein:
said first counter comprises a Write counter;
said second counter comprises a Read counter; and
further comprising a first in/first out data register with a data input for receiving external input data and a data output for outputting accessed data, said input data being clocked into said register to a position corresponding to said Write pointer and clocked by said received external clock, and data output from said register from a position corresponding to said Read pointer and clocked by said clock generator.

12. The jitter attenuator of claim 9 wherein said phase comparator, said clock generator and said lock means comprise a first order lock phase loop.

13. The clock generator of claim 9 wherein:
said digital error correction signal is quantized in $2\pi$ radian intervals of said phase error value for each digital bit value of said digital error correction signal; and
said lock means is operable to vary the frequency of said clock generator means in quantized steps for each bit change in said digital error correction signal, each step corresponding to substantially equal frequency changes in said clock generator.

14. The jitter attenuator of claim 13 wherein said clock generator comprises a switched capacitor crystal oscillator with decoder means for receiving the digital phase error signal and decoding the digital phase error signal to output control signals to select the combination of switched capacitors to provide the linear quantized steps.

15. A method for attenuating jitter on a received clock and associated received data, comprising:

temporarily storing the data in an elastic store device by inputting the received data thereto at the received clock rate, the received clock comprising a Write clock, and outputting the stored data at a separate clock rate generated by a Read clock;

generating the Read clock which has a frequency that varies in discrete steps in response to receiving a digital control signal, each of the discrete steps being substantially equal;

determining the phase difference between the Write clock and the Read clock;

controlling the frequency of the Read clock to maintain the average phase difference at a static difference by varying the value of the digital control signal, each discrete value of the digital control signal representing a finite amount of the phase difference, the magnitude of the variation in frequency of the Read clock being a function of the amount that the magnitude of the phase difference varies from the static difference, the step of controlling the frequency operable to attenuate phase variations of the Read clock relative to phase variations in the Write clock; and the variations of the frequency of the Read clock relative to the phase error being substantially linear.

16. The method of claim 15 wherein:

the step of determining the phase difference comprises determining the phase difference between the Write clock and the Read clock and generating a phase error signal; and the step of controlling the frequency comprises generating the digital control signal having a digital value that changes in discrete increments for each change of x radians in the phase difference, where x is equal to a predetermined amount of phase change in the phase error signal, the step of controlling varying the frequency of the Read clock as a function of the digital control signal to maintain an average phase error between the Read clock and the Write clock, the average phase error comprising the static difference.

17. The method of claim 16 wherein the step of determining the phase difference and the step of generating the phase error signal comprise:

incrementing a Write counter with the Write clock;
incrementing a Read counter with the Read clock; and calculating the difference between the Write counter and the Read counter to output the phase error signal which is in a digital format;

the step of varying the frequency being operable to receive the phase error signal in the digital format.

18. The method of claim 16 wherein the step of generating the phase error signal comprises:

generating a digital phase error signal that is quantized in increments for each $2\pi$ radians of the phase error signal;

the step of varying the frequency comprising varying the frequency of the Read clock in quantized steps for each bit change in the digital phase error signal.

19. The method of claim 18 and further comprising changing the size of the quantized step in frequency when the phase difference exceeds a predetermined threshold in either the positive or the negative direction.

20. The method of claim 19 wherein the step of generating the Read clock comprises:

providing a switched capacitor crystal oscillator;
receiving the digital phase error signal and decoding the digital phase error signal to output control signals to select individual ones of capacitors in the switched capacitor oscillator; and selecting the combination of switched capacitors in the switched capacitor crystal oscillator in accordance with the output control signals in order to provide linear quantized steps.

21. The method of claim 15 wherein the step of temporarily storing input data comprises:

providing a FIFO data register having a plurality of data storage locations for storing data;

incrementing a Write pointer in a predetermined sequence to determine the data storage locations in the FIFO data register to which the received data is to be stored;

incrementing a Read pointer in the predetermined sequence to determine the data storage locations in the FIFO data register from which data is to be output from, the Read pointer incremented by the Read clock; and the phase difference comprising the difference between the Write pointer and the Read pointer.

* * * * *